(12) United States Patent
Bubel et al.

(10) Patent No.: US 12,610,767 B2
(45) Date of Patent: Apr. 21, 2026

(54) ADDITIVES FOR GRINDING SEMICONDUCTOR WORKPIECES

(71) Applicant: Wolfspeed, Inc., Durham, NC (US)

(72) Inventors: Simon Bubel, Carrboro, NC (US);
Dinusha Priyadarshani Karunaratne,
Cary, NC (US)

(73) Assignee: Wolfspeed, Inc., Durham, NC (US)

( * ) Notice: Subject to any disclaimer, the term of this
patent is extended or adjusted under 35
U.S.C. 154(b) by 0 days.

(21) Appl. No.: 18/598,859

(22) Filed: Mar. 7, 2024

(65) Prior Publication Data

US 2025/0285873 A1 Sep. 11, 2025

(51) Int. Cl.
| | |
|---|---|
| *C09G 1/02* | (2006.01) |
| *B24B 1/00* | (2006.01) |
| *B24B 7/22* | (2006.01) |
| *B24B 57/02* | (2006.01) |
| *H01L 21/306* | (2006.01) |

(52) U.S. Cl.
CPC .......... *H01L 21/30625* (2013.01); *B24B 1/00*
(2013.01); *B24B 7/228* (2013.01); *B24B 57/02*
(2013.01)

(58) Field of Classification Search
CPC ....... C09G 1/00; C09G 1/02; H01L 21/30625;
H01L 21/3212
See application file for complete search history.

(56) References Cited

U.S. PATENT DOCUMENTS

| | | | |
|---|---|---|---|
| 5,958,794 A | 9/1999 | Bruxvoort et al. | |
| 9,484,413 B2 | 11/2016 | Van Brunt et al. | |

| | | | |
|---|---|---|---|
| 10,576,585 B1 | 3/2020 | Donofrio et al. | |
| 10,734,240 B2 | 8/2020 | Liu | |
| 11,040,427 B2 | 6/2021 | Takenouchi | |
| 11,219,966 B1 | 1/2022 | Donofrio et al. | |
| 11,654,596 B2 | 5/2023 | Bubel et al. | |
| 11,901,181 B2 | 2/2024 | Donofrio et al. | |

(Continued)

FOREIGN PATENT DOCUMENTS

| | | |
|---|---|---|
| CN | 112809458 | 5/2021 |
| WO | WO 2002/066207 | 8/2002 |

OTHER PUBLICATIONS

Disco, "Chemical-Free Stress Relief Dry Polishing Wheel", DP08
Series Product Inforamtion, https://www.discousa.com/eg/products/
dry_wheel/dp08.html, retrieved on Mar. 7, 2024, 3 pages.
Rena, "Ace Advanced Electrochemical Etching for SiC-Wafers",
https://www.rena.com/en/technology/innovations/sic-electrochemical-
etching, retrieved on Mar. 7, 2024, 5 pages.

(Continued)

*Primary Examiner* — Thomas T Pham
(74) *Attorney, Agent, or Firm* — Dority & Manning, P.A.

(57) ABSTRACT

Systems and methods for grinding semiconductor work-
pieces are provided. In one example, a method includes
providing a surface of the semiconductor workpiece against
a grinding apparatus. The grinding apparatus includes an
abrasive surface. The method further includes imparting
relative motion between the abrasive surface and the semi-
conductor workpiece to implement a grinding operation on
the semiconductor workpiece. The method further includes
providing a fluid to the surface of the semiconductor work-
piece or the abrasive surface during the grinding operation.
The fluid includes an additive. The additive includes one or
more of an oxidizing agent, an etchant, a surfactant, or a
lubricant.

22 Claims, 5 Drawing Sheets

(56) References Cited

U.S. PATENT DOCUMENTS

| | | | |
|---|---|---|---|
| 2003/0008483 A1 | 1/2003 | Sato et al. | |
| 2004/0006924 A1* | 1/2004 | Scott | C09K 3/1445 |
| | | | 438/692 |
| 2009/0011598 A1* | 1/2009 | Nagaya | H01L 29/1608 |
| | | | 438/692 |
| 2011/0227068 A1 | 9/2011 | Akiyama | |
| 2014/0117380 A1* | 5/2014 | Loboda | B24B 7/228 |
| | | | 438/692 |
| 2015/0325654 A1 | 11/2015 | Corona et al. | |
| 2016/0279757 A1* | 9/2016 | Qian | B24B 37/205 |
| 2017/0047396 A1 | 2/2017 | Van Brunt et al. | |
| 2018/0369990 A1 | 12/2018 | Takenouchi | |
| 2021/0367029 A1 | 11/2021 | Van Brunt et al. | |
| 2023/0128739 A1* | 4/2023 | Grasso | B24B 37/044 |
| | | | 451/60 |
| 2023/0246073 A1 | 8/2023 | Harrington, III | |

OTHER PUBLICATIONS

Son et al., "Contact-Area-Changeable CMP Conditioning for Enhancing Pad Lifetime", Applied Sciences MDPI, vol. 11, No. 3521, Apr. 14, 2021, pp. 1-15.

Zhu et al., "Grinding Marks in Back Grinding of Wafer with Outer Rim", Institute of Mechanical Engineers, Journal of Mechanical Engineering Science, Jan. 27, 2020, pp. 1-12.

Thomas Edgar Harrington, III, U.S. Appl. No. 18/430,866, filed Feb. 2, 2024, Power Semiconductor Devices with Stacked Layers.

International Search Report and Written Opinion for Application No. PCT/US2025/018726, mailed Jun. 30, 2025, 17 pages.

Bonnin et al., "A Greener SiC Wafer with Smart Cut Technology", Compound Semiconductor, vol. 27, No. VI, 2021, pp. 18-22.

International Search Report and Written Opinion for Application No. PCT/US2025/013761, mailed Jun. 17, 2025, 24 pages.

* cited by examiner

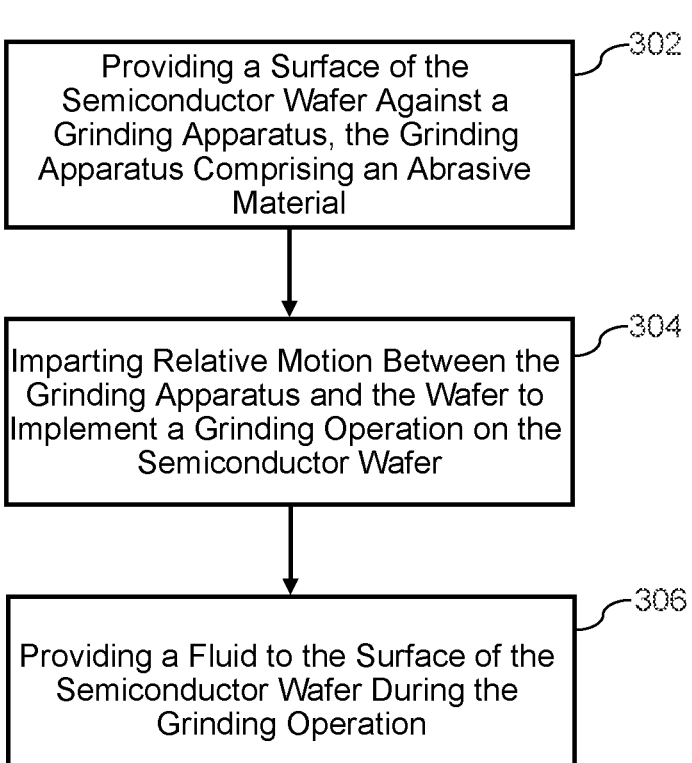

300

302
Providing a Surface of the Semiconductor Wafer Against a Grinding Apparatus, the Grinding Apparatus Comprising an Abrasive Material 304
Imparting Relative Motion Between the Grinding Apparatus and the Wafer to Implement a Grinding Operation on the Semiconductor Wafer 306
Providing a Fluid to the Surface of the Semiconductor Wafer During the Grinding Operation

FIG. 4

400

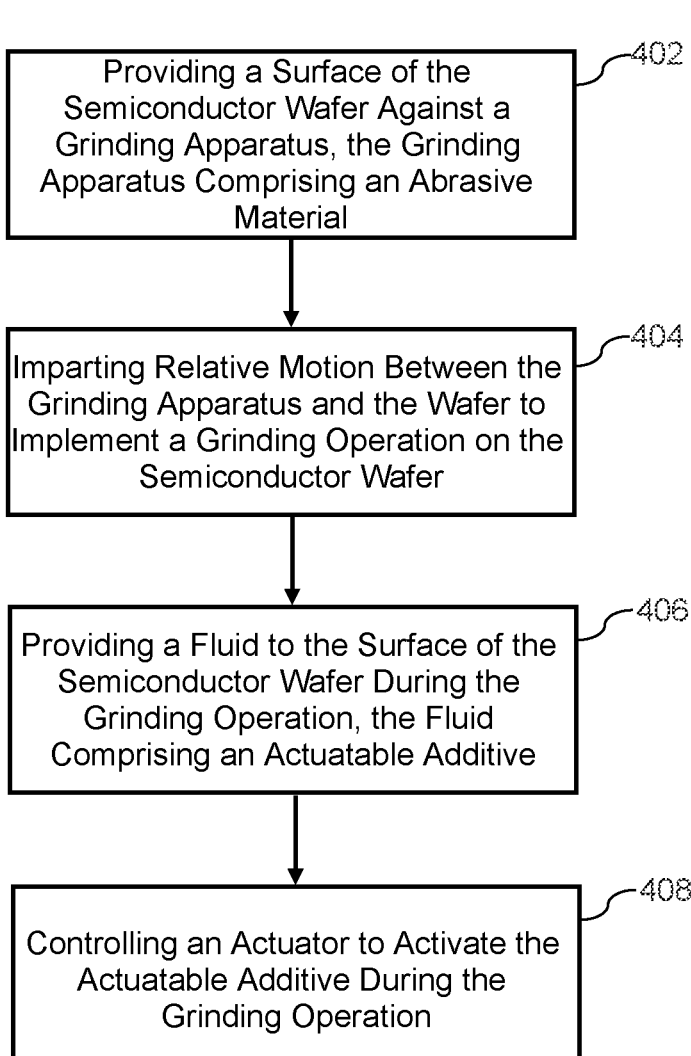

```
┌─────────────────────────────────┐
│   Providing a Surface of the    │── 402
│  Semiconductor Wafer Against a  │
│   Grinding Apparatus, the       │
│   Grinding Apparatus            │
│  Comprising an Abrasive         │
│         Material                │
└─────────────────────────────────┘
              │
              ▼
┌─────────────────────────────────┐
│ Imparting Relative Motion       │── 404
│ Between the Grinding Apparatus  │
│ and the Wafer to Implement a    │
│ Grinding Operation on the       │
│ Semiconductor Wafer             │
└─────────────────────────────────┘
              │
              ▼
┌─────────────────────────────────┐
│ Providing a Fluid to the        │── 406
│ Surface of the Semiconductor    │
│ Wafer During the Grinding       │
│ Operation, the Fluid            │
│ Comprising an Actuatable        │
│ Additive                        │
└─────────────────────────────────┘
              │
              ▼
┌─────────────────────────────────┐
│ Controlling an Actuator to      │── 408
│ Activate the Actuatable         │
│ Additive During the Grinding    │
│ Operation                       │
└─────────────────────────────────┘
```

FIG. 5

ADDITIVES FOR GRINDING SEMICONDUCTOR WORKPIECES

FIELD

The present disclosure relates generally to semiconductor workpieces and fabrication processes for semiconductor workpieces, such as semiconductor wafers used in semiconductor device fabrication.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), Schottky diodes, bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices. Example semiconductor devices may be power modules, which may include one or more power devices and other circuit components and can be used, for instance, to dynamically switch large amounts of power through various components, such as motors, inverters, generators, and the like. These semiconductor devices may be fabricated from wide bandgap semiconductor materials, such as silicon carbide ("SiC") and/or Group III nitride-based semiconductor materials. The fabrication process may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

One example aspect of the present disclosure is directed to a method for grinding a semiconductor workpiece. The method includes providing a surface of the semiconductor workpiece against a grinding apparatus. The grinding apparatus includes an abrasive surface. The method further includes imparting relative motion between the abrasive surface and the semiconductor workpiece to implement a grinding operation on the semiconductor workpiece. The method further includes providing a fluid to the surface of the semiconductor workpiece or the abrasive surface during the grinding operation. The fluid includes an additive. The additive includes one or more of an oxidizing agent, an etchant, a surfactant, or a lubricant.

Another example aspect of the present disclosure is directed to a method for grinding a semiconductor workpiece. The method includes providing a surface of the semiconductor workpiece against a grinding apparatus having an abrasive surface. The method further includes imparting relative motion between the abrasive surface and the semiconductor workpiece to implement a grinding operation on the semiconductor workpiece. The method further includes providing a fluid to the surface of the semiconductor workpiece or to the abrasive surface during the grinding operation. The fluid includes an actuatable additive.

Another example aspect of the present disclosure is directed to a grinding system for implementing a grinding operation on a semiconductor workpiece. The grinding system includes a workpiece support operable to support or carry a semiconductor workpiece. The grinding system further includes a grinding apparatus comprising an abrasive surface. The grinding apparatus is operable to rotate about an axis to implement a grinding operation on the semiconductor workpiece. The grinding system further includes a fluid delivery system operable to deliver a fluid to a surface of the semiconductor workpiece during the grinding operation. The fluid includes an additive. The additive includes one or more of an oxidizing agent, an etchant, an abrasive containing additive, an actuatable additive, a surfactant, or a lubricant.

Another example aspect of the present disclosure is directed to a method for grinding a semiconductor workpiece. The method includes providing a surface of the semiconductor workpiece against a grinding apparatus, the grinding apparatus comprising an abrasive surface. The method further includes imparting relative motion between the abrasive surface and the semiconductor workpiece to implement a grinding operation on the semiconductor workpiece. The method further includes providing a coolant to the surface of the semiconductor workpiece or the abrasive surface during the grinding operation. The coolant includes an abrasive containing additive.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which:

FIG. 4 depicts a flow diagram of an example method according to example embodiments of the present disclosure;

FIG. 5 depicts a flow diagram of an example method according to example embodiments of the present disclosure.

DETAILED DESCRIPTION

Figure 1:
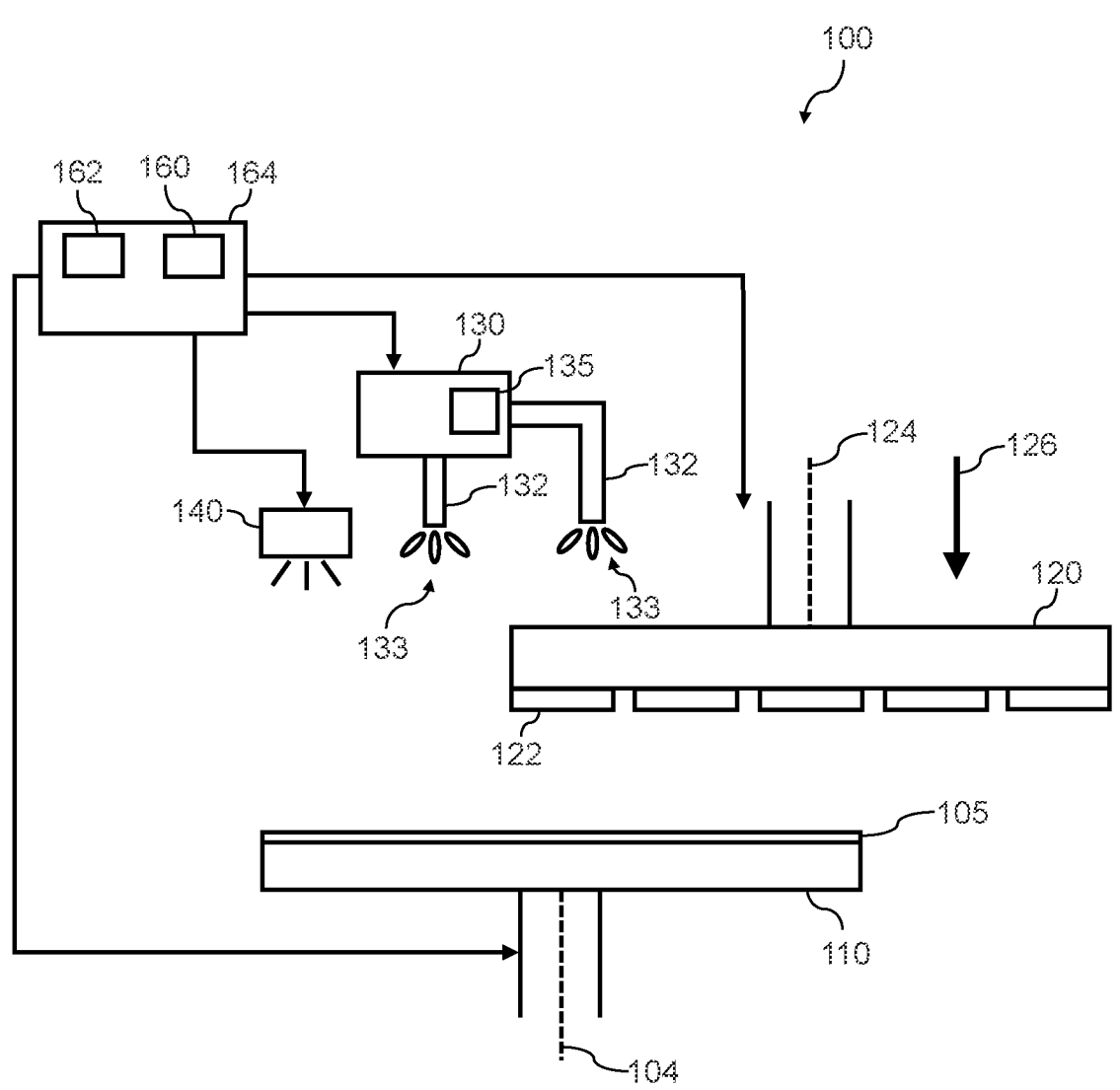
FIG. 1 depicts an example grinding system for a silicon carbide semiconductor wafer according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the power semiconductor devices may be fabricated using any semiconductor material, such as other wide bandgap semiconductor materials, without deviating from the scope of the present disclosure. Example wide bandgap semiconductor materials include silicon carbide and Group III-nitrides.

Power semiconductor devices may be fabricated using epitaxial layers formed on a semiconductor workpiece, such as a silicon carbide semiconductor wafer. Power semiconductor device fabrication processes may include surface processing operations that are performed on the silicon carbide semiconductor wafer to prepare one or more surfaces of the silicon carbide semiconductor wafer for later processing steps, (such as surface implantation, formation of epitaxial layers, metallization, etc.). Example surface processing operations may include grinding operations, lapping operations, and polishing operations.

Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 mm, such as greater than about 5 mm, such as greater than about 10 mm, such as greater than about 20 mm, such as greater than about 50 mm, such as greater than about 100 mm, to 200 mm, etc.

Grinding is a material removal process that is used to remove material from the semiconductor wafer. Grinding may be used to reduce a thickness of a semiconductor wafer. Grinding typically involves exposing the semiconductor wafer to an abrasive containing surface, such as grind teeth on a grind wheel. Grinding may remove material of the semiconductor wafer through engagement with the abrasive surface.

Lapping is a precision finishing process that uses a loose abrasive in slurry form. The slurry typically includes coarser particles (e.g., largest dimension of the particles being greater than about 100 microns) to remove material from the semiconductor wafer. Lapping typically does not include engaging the semiconductor wafer with an abrasive-containing surface on the lapping tool (e.g., a wheel or disc having an abrasive-containing surface). Instead, the semiconductor wafer typically comes into contact with a lapping plate or a tile usually made of metal. Lapping typically provides better planarization of the semiconductor wafer relative to grinding.

Polishing is a process to remove imperfections and create a smooth surface with a low surface roughness. Polishing may be performed using a slurry and a polishing pad. The slurry typically includes finer particles relative to lapping, but coarser particles relative to chemical mechanical planarization (CMP). Polishing typically provides better planarization of the semiconductor wafer relative to grinding.

CMP is a type of fine or ultrafine polishing, typically used to produce a smoother surface ready, for instance, for epitaxial growth of layers on the semiconductor wafer. CMP may be performed chemically and/or mechanically to remove imperfections and to create a smooth and flat surface with low surface roughness. CMP typically involves changing the material of the semiconductor through a chemical process (e.g., oxidation) and removing the new material from the semiconductor wafer through abrasive contact with a slurry and/or other abrasive surface or polishing pad (e.g., oxide removal). In CMP, the abrasive elements in the slurry typically remove the product of the chemical process and do not remove the bulk material of the semiconductor wafer, often leaving reduced subsurface damage.

Grinding may include coarse grinding operations and fine grinding operations. Coarse grinding operations may be used to reduce a thickness of a silicon carbide semiconductor wafer by about 20 microns to about 200 microns, such as about 25 microns to about 100 microns, such as by about 25 microns to about 80 microns, such as by about 40 microns to about 60 microns, or the like. Fine grinding operations may reduce a thickness of a silicon carbide semiconductor wafer by about 0.5 microns to about 20 microns, such as by about 3 microns to about 15 microns, such as by about 5 microns to about 10 microns, or the like. After grinding, the silicon carbide semiconductor wafer may be subject to other surface processing operations, such as lapping operations and/or polishing operations, such as chemical mechanical polishing (CMP) operations.

Grinding silicon carbide semiconductor wafers may pose several challenges due to the inherent properties of the material. Silicon carbide is an extremely hard and brittle compound with a high level of abrasiveness, making the grinding process more demanding. One challenge is the potential for excessive tool wear and heat generation during grinding, which can affect the quality of the finished product. The hardness of silicon carbide may also lead to the formation of cracks or fractures if not properly managed, impacting the structural integrity of the material. Additionally, achieving precise dimensions and surface finishes can be challenging due to the resistance of silicon carbide to abrasion. Controlling parameters such as grind wheel selection, speed, feed rates, and cooling mechanisms may be important to overcome these challenges and to providing successful fabrication of silicon carbide components with the desired properties and performance.

Some grinding systems (e.g., Blanchard grinders) may include a rotary table and a vertical spindle that holds a grind wheel with a plurality of abrasive grinding teeth. The grinding teeth may include an abrasive containing material having abrasive elements. The semiconductor wafer may be mounted on the rotary table, for instance, using a chuck (e.g., vacuum chuck). In some examples, the axis of rotation of the semiconductor wafer is not aligned with the axis of rotation of the grind wheel. During the grinding process, the abrasive grinding teeth on the grind wheel traverse across a portion of the surface of the semiconductor wafer, removing material from the semiconductor wafer.

Aspects of the present disclosure are discussed with reference to a Blanchard grinding system for purposes of illustration and discussion. However, those of ordinary skill in the art, using the disclosures provided herein, will understand that aspects of the present disclosure may be used with other grind systems, such as grind systems that include a grind disc with an abrasive surface configured to grind silicon carbide.

Grinding systems may include a fluid delivery system (e.g., coolant delivery system) to deliver a fluid, such as a coolant (e.g., deionized water), to the abrasive surfaces (e.g., grinding teeth) and to the surface of the silicon carbide semiconductor wafer. The fluid may be used to manage process temperatures, to remove debris, and to provide lubrication during a grinding process.

Issues that may arise with grinding processes may include grind wheel glazing. Grind wheel glazing occurs when an abrasive containing material on the grinding teeth or other abrasive surface loses abrasiveness over time. Grind wheel dressing may be used to address grind wheel glazing by removing the old abrasive elements (e.g., diamond elements) in the abrasive containing material and exposing new abrasive elements (e.g., new diamond elements). Grind wheel dressing may be accomplished by moving the grinding teeth against a dressing surface (e.g., a diamond containing dressing surface or other abrasive containing surface) to remove the old abrasive elements and/or to remove the host material embedding the abrasive elements to expose additional abrasive elements. Grind wheel glazing may also be addressed by changing out the abrasive elements and/or abrasive containing material on the grind wheel or changing out the grind wheel altogether in the grinding system. Other grinding issues may include grind wheel loading with grind product (e.g., abrasive debris and/or semiconductor wafer debris).

Aspects of the present disclosure are directed to including an additive in the fluid (e.g., coolant) of a grinding system to address abrasive surface glazing and other issues. By incorporating the additive in the fluid (e.g., coolant), grind parameters and abrasive materials for the grind wheel may be chosen more independently to achieve desired grind characteristics (e.g., surface quality, wheel wear, removal rates, etc.). In some examples, the additive may be or may include, for instance, an oxidizing agent, an etchant, and/or abrasive elements. In some examples, the additive may include an actuatable additive. In some examples, the additive may include a surfactant and/or a lubricant to affect the transport of grind products. Grind products refer to debris, particles (e.g., loose particles), and other materials removed from the abrasive surface and/or semiconductor wafer during a grinding operation.

In some examples, the additive is part of a coolant, but causes an exothermic reaction. In these examples, although the additive is causing an exothermic reaction, the fluid provided with the additive is still considered a "coolant" for purposes of the present disclosure.

For instance, in some examples, the additive may include an oxidizing agent. The oxidizing agent may be operable to oxidize one or more of the abrasive surface of the grinding teeth and/or the semiconductor wafer. The oxidizing agent may be operable to oxidize one or more grind products. The oxidized portions or grind product may be later removed using an oxide removal process (e.g., with a reducing agent). In some examples, the oxidizing agent may include, for instance, one or more of hydrogen peroxide, urea peroxide, potassium hypochlorite, sodium hypochlorite, ammonium persulfate, potassium permanganate, potassium periodate, and/or potassium persulfate. In some examples, the oxidizing agent may include an organic peroxide, such as one or more of benzoyl peroxide or dimethyl peroxide. In some examples, the oxidizing agent includes hydrogen peroxide, and the fluid includes one or more $Fe^{+2}$ compounds. In some examples the oxidizing agent (e.g., hydrogen peroxide) may include additional chemical elements to improve their oxidizing properties, such as $NaHCO_3$ and/or $KHCO_3$.

In some examples, the additive may include an etchant. The etchant may be operable to etch (e.g., chemically etch) one or more of the semiconductor wafer and/or the abrasive containing material of the grind wheel. In some examples, the etchant is a caustic compound, such as potassium hydroxide, calcium hydroxide, or sodium hydroxide.

In some examples, the additive may include additional abrasive elements. The abrasive containing additive may include a plurality of abrasive particles. The abrasive particles may include, in some embodiments, one or more of chromium oxide, cerium oxide, aluminum oxide, and/or silicon oxide. In some embodiments, the plurality of abrasive particles may be fine abrasive particles having a largest dimension of less than about 100 microns, such as less than about 50 microns, such as less than about 10 microns.

In some examples, a concentration of the additive in the fluid (e.g., coolant) is in a range of about 0.1% by volume to about 20% by volume, such as in a range of about 0.1% by volume to about 10% by volume, such as about 0.1% by volume to about 5%, by volume, such as about 5% by volume to about 20% by volume, such as about 5% by volume to about 10% by volume. Other suitable concentrations may be used, in some implementations, without deviating from the scope of the present disclosure. For instance, in some examples, a concentration of about 20% by volume or greater, such as in a range of about 20% by volume to about 50% by volume may be used in implementations where the fluid (e.g., coolant) is recirculated in the grinding system.

In some examples, the additive may include an actuatable material (herein an "actuatable additive") that is activated by an external stimulus (e.g., an actuator). For instance, the actuatable material may include a material that is activated by one or more of an electrostatic actuator, electrochemical actuator, acoustic actuator, ultrasonic actuator, optical actuator, thermal actuator, or plasma-based actuator. For instance, in some embodiments, the additive may be inert and not react with an abrasive surface and/or the silicon carbide semiconductor wafer until the material is actuated by the external actuator. In some embodiments, the additive may be activated to react with the abrasive surface (e.g., abrasive grinding teeth) and/or the silicon carbide semiconductor wafer only when exposed (or not exposed) to the external stimulus from the actuator. In this way, the active properties of the additive may be controlled (e.g., pulsed) by controlling the actuator.

The additive may be provided as part of a fluid (e.g., coolant) in the grinding system in various ways. For instance, in some examples, the fluid may be delivered using a fluid delivery system (e.g., coolant delivery system) including one or more fluid outlets that provide fluid to a surface of the semiconductor wafer or to the abrasive surface of the grind wheel. In some examples, the fluid may be delivered through one or more apertures in the grinding apparatus.

In some examples, providing the additive may include providing a first fluid having a first additive and providing a second fluid having a second additive. The first additive may be provided, for instance, through a fluid delivery system. The second additive may be provided through a different fluid delivery system relative to the first additive, such as through apertures in the grinding apparatus, or is already part of the abrasive containing surface, etc. In some examples, the first additive may be activated when interacting with the second additive.

Aspects of the present disclosure provide a number of technical effects and benefits. For instance, in some examples, the additive in the fluid (e.g., coolant) may act on a semiconductor wafer surface that has been damaged, amorphized, or phase changed during the grinding process. In some examples, the additive may act on the abrasive containing material of the grinding teeth. In some examples, the additive may reduce wheel glazing. In some examples, the additive may reduce loading of the abrasive containing material with wear debris or grind product. In some examples, the additive may help the decomposition of the abrasive containing material in order to expose active grind surfaces.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 depicts an example grinding system 100 for grinding a silicon carbide semiconductor wafer 105 according to example embodiments of the present disclosure. The silicon carbide semiconductor wafer 105 may include 4H silicon carbide, 6H silicon carbide or other crystal structure. The silicon carbide semiconductor wafer 105 may be doped or undoped. The grinding system 100 includes a workpiece support 110, a grinding apparatus such as a grind wheel 120, a fluid delivery system 130, and a controller 160. In some examples, the grinding system 100 may include an actuator 140 as will be described in more detail below.

More specifically, the grinding system 100 includes the workpiece support 110. The workpiece support 110 may be operable to support or carry the semiconductor wafer 105. The workpiece support 110 may include a chuck operable to hold the semiconductor wafer 105. The chuck may be a vacuum chuck, electrostatic chuck, or other suitable support operable to hold the semiconductor wafer 105 in place during a grinding operation. The workpiece support 110 may be operable to rotate about an axis 104. The workpiece support 110 may be operable to rotate about the axis 104 in either a clockwise or counterclockwise direction. In some examples, the workpiece support 110 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm.

The grinding system 100 includes a grind wheel 120. The grind wheel 120 includes a plurality of grinding teeth 122 arranged in an annular configuration about the grind wheel 120. The grinding teeth 122 provide an abrasive surface for the grind wheel 120. Each of the grinding teeth 122 includes an abrasive containing material. The abrasive containing material of the grinding teeth 122 may be sufficient to perform a grinding operation on silicon carbide. In some embodiments, the grinding operation may be a coarse grinding operation or a fine grinding operation.

The abrasive containing material may include a plurality of abrasive elements (e.g., abrasive particles) in a host material or matrix. In some examples, the host material may include one or more of vitreous material, metal, resin, and/or other sintered material and/or organic material. The vitreous material may be a glass matrix material to hold the abrasive elements inside a matrix. Metals and/or organic materials may be used as a host matrix or as part of a host matrix for the abrasive elements. The abrasive elements in some embodiments, may be diamond (e.g., diamond abrasive particles) or a diamond coated material. In some embodiments, the abrasive elements may be, for instance, a ceramic material (e.g., ceramic abrasive particles). The ceramic material may be, for instance, boron carbide ($B_4C$) and cubic boron nitride (BN). In some examples, the abrasive elements may include one or more metal oxides (sintered and/or unsintered). In some embodiments, the abrasive elements may include silica, ceria, zirconia, alumina, silicon carbide, metal nitrides, and/or other carbides or in general one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide. In some examples, the abrasive elements of the grinding teeth 122 may have a hardness in a range of about 7 Mohs to about 10 Mohs, such as about 10 Mohs.

Figure 2:
FIG. 2 depicts a grind wheel used in the grinding system of FIG. 1 according to example embodiments of the present disclosure.
Figure 2:
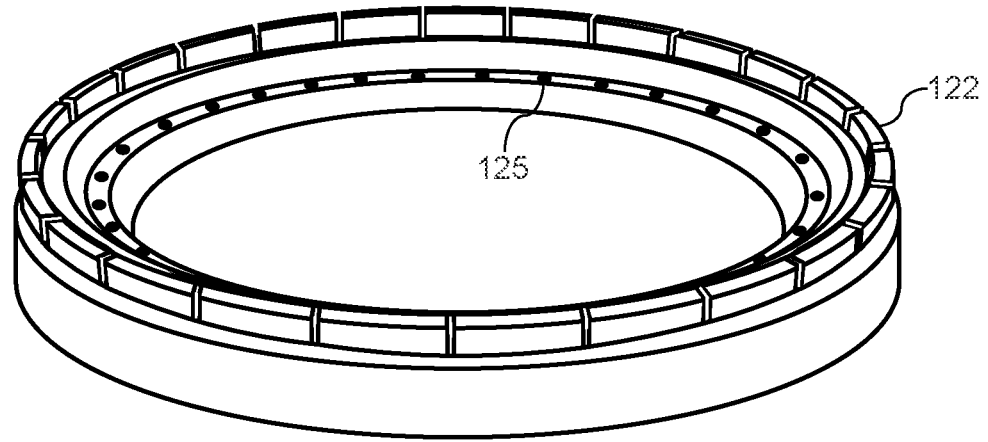

FIG. 2 depicts a perspective view of an example grind wheel 120 according to examples of the present disclosure. As illustrated, the grind wheel 120 includes the plurality of grinding teeth 122 arranged in an annular configuration about the grind wheel 120. For instance, the grinding teeth 122 are arranged in a concentric ring about the center of the grind wheel 120. There may be a space between each of the grinding teeth 122. Each of the grinding teeth 122 may have a generally rectangular shape. However, the grinding teeth 122 may include other suitable shapes and configurations without deviating from the scope of the present disclosure.

Referring back to FIG. 1, the grind wheel 120 may be operable to rotate about an axis 124. The axis 124 is not aligned with the axis 104 associated with the workpiece support 110. The grind wheel 120 may be operable to rotate in either a clockwise or counterclockwise direction. In some examples, the grind wheel 120 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm. The grind wheel 120 may rotate in the same direction as the workpiece support 110 or in a different direction relative to the workpiece support 110.

The grind wheel 120 may be controlled to provide a downforce 126 on the silicon carbide semiconductor wafer 105. The downforce 126 may be controlled to adjust the grinding rate of the grinding operation of the silicon carbide semiconductor wafer 105. A higher downforce may result in a faster grinding rate. The grind wheel 120 may be controlled to be in contact with the semiconductor wafer 105 such that the plurality of grinding teeth 122 pass through a center of the semiconductor wafer 105 during a grinding operation.

As shown in FIG. 1, the grinding system 100 may include a fluid delivery system 130. The fluid delivery system 130 may be used to deliver a fluid 133 (e.g., coolant), such as deionized water, to a surface of the semiconductor wafer 105 and/or the grind wheel 120 (e.g., the grinding teeth 122) during a grinding process, such as a coarse grinding process or a fine grinding process. The fluid delivery system 130 is depicted as having two fluid delivery outlets 132 for purposes of illustration and discussion. Those of ordinary skill in the art, using the disclosures provided herein, will understand that the grinding system 100 may include more or fewer fluid delivery outlets arranged to deliver a fluid 133 to the grind wheel 120 and/or the semiconductor wafer 105 without deviating from the scope of the present disclosure.

In some examples, the fluid delivery system 130 may include or be coupled to an additive delivery system 135. The additive delivery system 135 may be configured to provide one or more additives with the fluid 133 (e.g., coolant) through the fluid delivery system 130. In some examples, the additive may include one or more of an oxidizing agent, an etchant, or an abrasive containing additive. In some examples, the additive may include an actuatable additive. In some examples, the additive may be a surfactant and/or a lubricant that affect the transport of grind products.

For instance, in some examples, the additive may include an oxidizing agent. The oxidizing agent may be operable to oxidize one or more of the abrasive containing material of the grinding teeth 122 and/or the semiconductor wafer 105. The oxidized portions may be later removed using an oxide removal process (e.g., using a reducing agent). In some examples, the oxidizing agent may include, for instance, one or more of hydrogen peroxide, urea peroxide, potassium hypochlorite, sodium hypochlorite, ammonium persulfate, potassium permanganate, potassium periodate, and/or potassium persulfate. In some examples, the oxidizing agent may include an organic peroxide, such as one or more of benzoyl peroxide or dimethyl peroxide. In some examples, the oxidizing agent includes hydrogen peroxide, and the fluid includes one or more $Fe^{+2}$ compounds. In some examples the oxidizing agent (e.g., hydrogen peroxide) may include additional chemical elements to improve their oxidizing properties, such as $NaHCO_3$ and/or $KHCO_3$.

In some examples, the additive may include an etchant. The etchant may be operable to chemically etch one or more of the semiconductor wafer 105 and/or the abrasive containing material of the grind wheel 120. In some examples, the etchant is a caustic compound, such as potassium hydroxide, calcium hydroxide, or sodium hydroxide.

In some examples, the additive may include an abrasive containing additive. The abrasive containing additive may include a plurality of abrasive particles. The abrasive particles may include one or more of chromium oxide, cerium oxide, aluminum oxide, and/or silicon oxide.

In some examples, a concentration of the additive in the fluid 133 is in a range of about 0.1% by volume to about 20% by volume, such as in a range of about 0.1% by volume to about 10% by volume, such as about 0.1% by volume to about 5%, by volume, such as about 5% by volume to about 20% by volume, such as about 5% by volume to about 10% by volume. Other suitable concentrations may be used, in some implementations, without deviating from the scope of the present disclosure. For instance, in some examples, a concentration of about 20% by volume or greater, such as in a range of about 20% by volume to about 50% by volume may be used in implementations where the fluid 133 is recirculated in the grinding system 100.

The additive may be provided to the grinding system 100 in other ways without deviating from the scope of the present disclosure. For instance, fluid may be provided through the grind wheel 120. As an example, the grind wheel may include one or more apertures 125 (FIG. 2). A fluid 133 with an additive may be provided to the grinding teeth 122 and/or the semiconductor wafer 105 at least in part using the one or more apertures 125.

In some examples, as described above, the grinding system 100 may include an actuator 140. The actuator 140 may be configured to provide a stimulus to an actuatable additive to activate properties (e.g., reactive properties) of the additive. The actuator 140 may be any suitable device operable to provide a stimulus to the additive.

In some examples, the actuator 140 includes one or more of an electrostatic actuator, electrochemical actuator, acoustic actuator, ultrasonic actuator, optical actuator, ultraviolet actuator, thermal actuator, or plasma-based actuator. An electrochemical actuator may be operable to provide an electrochemical stimulus to the additive. An acoustic actuator may be operable to provide an acoustic stimulus to the additive. An ultrasonic actuator may be configured to provide an ultrasonic stimulus to the additive. An optical actuator may be configured to provide an optical stimulus to the additive. A thermal actuator may be operable to provide a heat stimulus to the additive (e.g., heat source, laser, lamp, etc.). An ultraviolet actuator (e.g., ultraviolet light source) may be operable to provide UV light stimulus to the additive. A plasma-based actuator may be operable to generate a plasma to act as a stimulus to the additive.

In some examples, for instance, an ultraviolet actuator may provide UV light stimulus to provide photochemical activation and/or photocatalytic effects in an actuatable additive, such as hydrogen peroxide and/or organic peroxide to generate, for instance, hydroxyl radicals. In some examples, activation of additives (e.g., photo activation of additives) may include using catalytic effects by providing elements or components in contact with the additive, such as $CeO_2$ elements, $TiO_2$ elements, or other metals and metal oxides.

In some embodiments, the additive may be inert and not react with the grinding teeth 122 or the silicon carbide semiconductor wafer 105 until the material is actuated by stimulus from the actuator 140. In some embodiments, the additive may be activated to react with the grinding teeth 122 and/or the silicon carbide semiconductor wafer 105 only when exposed (or not exposed) to the external stimulus from the actuator 140. In this way, the active properties of the additive may be controlled (e.g., pulsed) by controlling the actuator 140. For instance, by pulsing the actuator 140, the active properties of the additive may also be pulsed.

In some examples, the additive may be activated when it interacts (e.g., mixes, contacts, etc.) other additives or components in the grinding system 100. For instance, the additive may interact with other additives already present on the semiconductor wafer and/or the grind wheel 120 to activate properties of the additive.

For instance, in some examples, providing the additive may include providing a first fluid having a first additive and providing a second fluid having a second additive. The first additive may be provided, for instance, through the fluid delivery system 130. The second additive may be provided through a different fluid delivery system relative to the first additive, such as through apertures in the grind wheel 120, is already part of the abrasive containing surface of the grind teeth 122, etc. In some examples, the first additive may be activated when interacting with the second additive, or vice versa.

In some examples, the additive may be a surfactant and/or a lubricant that affect the transport of grind products. Example surfactants may include, for instance, nonionic surfactants, anionic surfactants (e.g., sodium dodecyl sulfate), amphoteric surfactants (e.g., cocamidopropyl betaine), fluorinated surfactants, citric acid surfactants, or other surfactants. Example lubricants may include, for instance, organic oils, fatty acids, polyethylene glycol, and/or alcohols with multi-OH groups (polyols).

The grinding system 100 includes one or more control devices, such as a controller 160. The controller 160 may include one or more processors 162 and one or more memory devices 164. The one or more memory devices 164 may store computer-readable instructions that when executed by the one or more processors 162 cause the one or more processors 162 to perform one or more control functions, such as any of the functions described herein. The controller 160 may be in communication with various other aspects of the grinding system 100 through one or more wired and/or wireless control links. The controller 160 may send control signals to the various components of the grinding system 100 (e.g., the workpiece support 110, the grind wheel 120, the fluid delivery system 130, the actuator 140) to implement a grinding operation on the silicon carbide semiconductor wafer 105.

Figure 3:
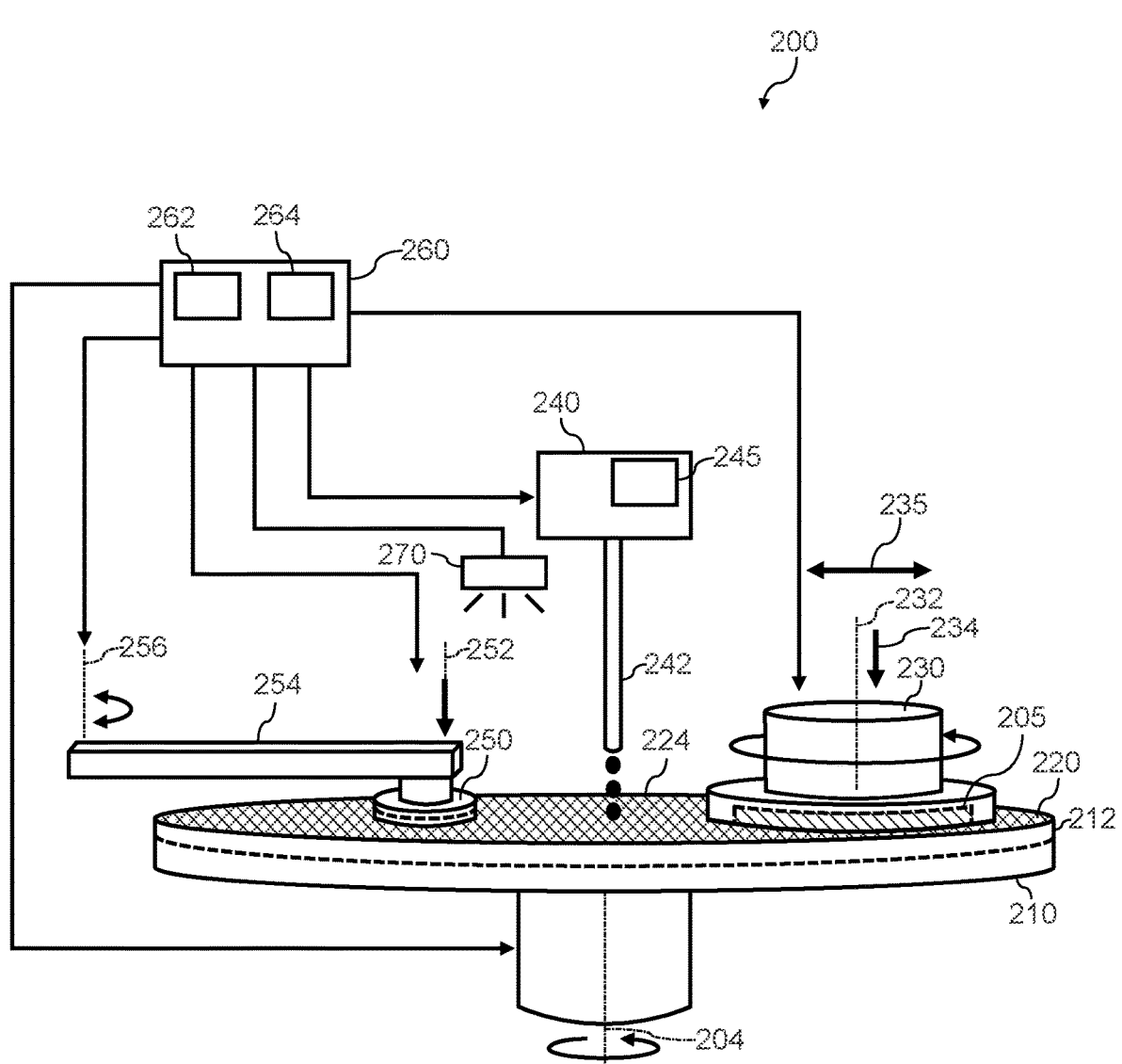
FIG. 3 depicts an example grinding system that uses a grind disc according to example embodiments of the present disclosure.

Aspects of the present disclosure may be implemented with other types of grinding systems without deviating from the scope of the present disclosure. For instance, FIG. 3 depicts an example grinding system 200 for a silicon carbide semiconductor wafer 205 according to example embodiments of the present disclosure. The grinding system 200 is similar to a CMP system, however, the grinding system 200 is operable to perform a grinding operation (e.g., a coarse grinding operation or a fine grinding operation) for a silicon carbide semiconductor wafer 205. The silicon carbide wafer 205 may include 4H silicon carbide, 6H silicon carbide or other crystal structure. The silicon carbide semiconductor wafer 205 may be doped or undoped. The grinding system 200 includes a platen 210, a grinding apparatus such as a grind disc 220, a workpiece carrier 230, a fluid delivery system 240, a conditioning head 250, and a controller 260.

The platen 210 may be operable to rotate about an axis 204. The platen 210 may be operable to rotate about the axis 204 in either a clockwise or counterclockwise direction. In some examples, the platen 210 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm. Higher rotational speeds, such as between 200 rpm and 10000 rpm may be beneficial for grinding process(s) using a grind disc according to examples of the present disclosure.

The platen 210 may include a receptacle 212. The receptacle 212 holds the grind disc 220. The receptacle 212 may be a surface configured to support or receive the grind disc 220. In some examples, the receptacle 212 may be a planar surface that supports the grind disc 220.

The grind disc 220 may be configured to grind silicon carbide. The grind disc 220 may have a first surface and an opposing second surface. The second surface may face the platen 210 such that the first surface is exposed for grinding the silicon carbide semiconductor wafer 205. The first surface of the grind disc 220 may include a continuous surface of an abrasive containing material 224 such that at least 75% of a surface area of the first surface of the grind disc 220 is an abrasive containing material having a plurality of abrasive elements (e.g., abrasive particles), such as at least 85% of the surface area of the first surface of the grind disc 220, such as at least 95% of the surface area of the first surface of the grind disc 220. In this way, substantially the entire surface of the grind disc 220 provides an abrasive surface for a grinding operation.

The abrasive containing material 224 of the grind disc 220 may be sufficient to perform a grinding operation on silicon carbide. In some embodiments, the grinding operation may be a coarse grinding operation or a fine grinding operation. The abrasive containing material 224 may include a plurality of abrasive elements (e.g., abrasive particles) in a host material or matrix. In some examples, the host material may include one or more of vitreous material, metal, resin, and/or other sintered material and/or organic material. The vitreous material may be a glass matrix material to hold the abrasive elements inside a matrix. Metals and/or organic material may be used as a host matrix or as part of a host matrix for the abrasive elements. The abrasive elements in some embodiments, may be diamond (e.g., diamond abrasive particles) or a diamond coated material. In some embodiments, the abrasive elements may be, for instance, a ceramic material (e.g., ceramic abrasive particles). The ceramic material may be, for instance, boron carbide ($B_4C$) and cubic boron nitride (BN). In some examples, the abrasive elements may include one or more metal oxides (sintered and/or unsintered). In some embodiments, the abrasive elements may include silica, ceria, zirconia, alumina, silicon carbide, metal nitrides, and/or other carbides or in general one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide.

The grind disc 220 may have a diameter. The diameter may be greater than a size of the silicon carbide semiconductor wafer 205. The grind disc 220 may have a diameter in a range of, for instance, about 150 millimeters to about 820 millimeters, such as in a range of about 150 millimeters to about 400 millimeters, such as in a range of about 150 millimeters to about 300 millimeters. In some examples, the diameter of the grind disc 220 may be smaller or nearly the same size as the diameter of the platen 210 (FIG. 3). However, the diameter of the grind disc 220 may be larger than the diameter of the platen 210 without deviating from the scope of the present disclosure. In some examples, the grind disc 220 may have a thickness in a range of about 2 millimeters to about 40 millimeters, such as in a range of about 5 millimeters to about 40 millimeters, such as in a range of about 10 millimeters to about 40 millimeters.

In some examples, the abrasive elements of the grind disc 220 may have a hardness in a range of about 7 Mohs to about 10 Mohs, such as about 10 Mohs. In some examples, the abrasive elements of the grind disc 220 may include a plurality of abrasive particles. In some examples, the abrasive elements of the grind disc may have a grit size. The grit size of the abrasive elements may be in a range of about FEPA grit size F500 to about FEPA grit size F90,000, such as a range of about FEPA grit size F500 to about FEPA grit size F14000, such as about FEPA grit size F600 to about FEPA grit size F1200.

The grinding system 200 includes a workpiece carrier 230. The workpiece carrier 230 may be considered a workpiece support operable to support or carry a semiconductor wafer 205. The workpiece carrier 230 is operable to bring one or more silicon carbide semiconductor wafers 205 into contact with the grind disc 220 to implement a grinding operation. In some examples, the workpiece carrier 230 may be operable to hold a single silicon carbide semiconductor wafer 205 for single wafer processing. In some examples, the workpiece carrier 230 may be operable to hold a plurality of silicon carbide semiconductor wafers 205 for batch processing.

The workpiece carrier 230 may be operable to rotate the silicon carbide semiconductor wafer 205 about an axis 232. The axis 232 is not aligned with the axis 204 associated with the platen 210. The workpiece carrier 230 may be operable to rotate the silicon carbide semiconductor wafer about the axis 204 in either a clockwise or counterclockwise direction. In some examples, the workpiece carrier 230 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm. The workpiece carrier 230 may rotate in the same direction as the platen 210 or in a different direction relative to the platen 210.

The workpiece carrier 230 may be able to provide a downforce 234 of the silicon carbide semiconductor wafer 205 against the grind disc 220. The downforce 234 of the workpiece carrier 230 may be controlled to adjust the grinding rate of the grinding operation of the silicon carbide semiconductor wafer 205. A higher downforce may result in a faster grinding rate.

The workpiece carrier 230 may also oscillate in a lateral direction 235 along the surface of the grind disc 220. This will allow exposure of the semiconductor wafer 205 to different portions of the grind disc 220 (e.g., at different radii of the grind disc 220) during a grinding operation.

The grinding system 200 may include a fluid delivery system 240. The fluid delivery system 240 may be configured to deliver a fluid (e.g., a coolant, such as deionized water) to the surface of the grind disc 220, for instance, through a fluid delivery outlet 242. The fluid delivery system 240 is depicted as having a single fluid delivery outlet 242 for purposes of illustration and discussion. Those of ordinary skill in the art, using the disclosures provided herein, will understand that the grinding system 200 may include multiple fluid delivery outlets arranged to deliver a fluid to the surface of the grind disc 220 without deviating from the scope of the present disclosure.

In some examples, the fluid delivery system 240 may include or be coupled to an additive delivery system 245. The additive delivery system 245 may be configured to provide one or more additives with the fluid provided to the surface of the grind disc 220 through the fluid delivery system 240.

In some examples, the additive may include one or more of an oxidizing agent, an etchant, or an abrasive containing additive. In some examples, the additive may include an actuatable additive.

For instance, in some examples, the additive may include an oxidizing agent. The oxidizing agent may be operable to oxidize one or more of the abrasive containing material of the grind disc 220 and/or the semiconductor wafer 205. The oxidized portions may be later removed using an oxide removal process. In some examples, the oxidizing agent may include, for instance, one or more of hydrogen peroxide, urea peroxide, potassium hypochlorite, sodium hypochlorite, ammonium persulfate, potassium permanganate, potassium periodate, and/or potassium persulfate. In some examples, the oxidizing agent may include an organic peroxide, such as one or more of benzoyl peroxide or dimethyl peroxide. In some examples, the oxidizing agent includes hydrogen peroxide, and the fluid includes one or more $Fe^{+2}$ compounds. In some examples the oxidizing agent (e.g., hydrogen peroxide) may include additional chemical elements to improve their oxidizing properties, such as $NaHCO_3$ and/or $KHCO_3$.

In some examples, the additive may include an etchant. The etchant may be operable to chemically etch one or more of the semiconductor wafer 205 and/or the abrasive containing material of the grind disc 220. In some examples, the etchant is a caustic compound, such as potassium hydroxide, calcium hydroxide, or sodium hydroxide.

In some examples, the additive may include an additional abrasive containing additive. The abrasive containing additive may include a plurality of abrasive particles. The abrasive particles may include one or more of chromium oxide, cerium oxide, aluminum oxide, and/or silicon oxide.

The additive may be provided to the surface of the grind disc 220 in other ways without deviating from the scope of the present disclosure, such as through apertures in the grind disc 220. In some examples, the grind disc 220 may include one or more perforations, deformations, holes, gaps, etc. to hold, retain, transport, or deliver an additive. In some examples, portions of the grind disc 220 may be porous to retain fluid additive for a grinding process.

The grinding system 200 may include a conditioning head 250. The conditioning head 250 may include an abrasive containing material (e.g., one or more of: (i) diamond; (ii) ceramic; (iii) metal nitride; (iv) metal oxide, (v) metal carbide; (vi) metalloid nitride; (vii) metalloid oxide; (viii) metalloid carbide; (ix) carbon group nitride; (x) carbon group oxide; or (xi) carbon group carbide) that is used to dress and remove glazing from the grind disc 220. The conditioning head 250 may rotate about an axis 252, such that the conditioning head 250 rotates along the surface of the grind disc 220 (e.g., in either a clockwise or counterclockwise direction). In some examples, the conditioning head 250 may be on a swing arm 254 that may swing about an axis 256 to move the conditioning head 250 to different locations on the grind disc 220. The conditioning head 250 may condition the grind disc 220 with an additive, such as any of the additives described herein.

In some examples, as described above, the grinding system 200 may include an actuator 270. The actuator 270 may be configured to provide a stimulus to an actuatable additive on the surface of the grind disc 220 to activate properties (e.g., reactive properties) of the additive. The actuator 270 may be any suitable device operable to provide a stimulus to the additive.

In some examples, the actuator 270 includes one or more of an electrostatic actuator, electrochemical actuator, acoustic actuator, ultrasonic actuator, optical actuator, ultraviolet actuator, thermal actuator, or plasma-based actuator. An electrochemical actuator may be operable to provide an electrochemical stimulus to the additive. An acoustic actuator may be operable to provide an acoustic stimulus to the additive. An ultrasonic actuator may be configured to provide an ultrasonic stimulus to the additive. An optical actuator may be configured to provide an optical stimulus to the additive. A thermal actuator may be operable to provide a heat stimulus to the additive (e.g., heat source, laser, lamp, etc.). An ultraviolet actuator may be operable to provide UV light stimulus to the additive. A plasma-based actuator may be operable to generate a plasma to act as a stimulus to the additive.

In some examples, for instance, an ultraviolet actuator may provide UV light stimulus to provide photochemical activation and/or photocatalytic effects in an actuatable additive, such as hydrogen peroxide and/or organic peroxide to generate, for instance, hydroxyl radicals. In some examples, activation of additives (e.g., photo activation of additives) may include using catalytic effects provided by providing elements or components in contact with the additive, such as $CeO_2$ elements, $TiO_2$ elements, or other metals and metal oxides in general.

In some embodiments, the additive may be inert and not react with a surface of the grind disc 220 and/or the silicon carbide semiconductor wafer 205 until the material is actuated by stimulus from the actuator 270. In some embodiments, the additive may be activated to react with the surface of the grind disc 220 and/or the silicon carbide semiconductor wafer 205 only when exposed (or not exposed) to the external stimulus from the actuator 270. In this way, the active properties of the additive may be controlled (e.g., pulsed) by controlling the actuator 270. For instance, by pulsing the actuator 270, the active properties of the additive are also pulsed.

In some examples, the additive may be activated when it interacts (e.g., mixes, contacts, etc.) other additives or components in the grinding system 200. For instance, the additive may interact with other additives already present on the semiconductor wafer 105 and/or the grind disc 220 to activate properties of the additive.

For instance, in some examples, providing the additive may include providing a first fluid having a first additive and providing a second fluid having a second additive. The first additive may be provided, for instance, through the fluid delivery system 240. The second additive may be provided through a different fluid delivery system relative to the first additive, such as through apertures in the grind disc 220, is already part of the abrasive containing surface of the grind disc 220, etc. In some examples, the first additive may be activated when interacting with the second additive, or vice versa.

The grinding system 200 includes one or more control devices, such as a controller 260. The controller 260 may include one or more processors 262 and one or more memory devices 264. The one or more memory devices 264 may store computer-readable instructions that when executed by the one or more processors 262 cause the one or more processors 262 to perform one or more control functions, such as any of the functions described herein. The controller 260 may be in communication with various other aspects of the grinding system 200 through one or more wired and/or wireless control links. The controller 260 may send control signals to the various components of the grinding system 200 (e.g., the platen 210, the workpiece carrier 230, the fluid delivery system 240, the conditioning head 250, the actuator 270) to implement a grinding operation on the silicon carbide semiconductor wafer 205.

FIG. 4 depicts a flow chart of an example method 300 according to example embodiments of the present disclosure. The method 300 may be implemented, for instance, using the grinding system 100 of FIG. 1 or the grinding system 200 of FIG. 3. The method 300 depicts operations performed in a particular order for purposes of illustration and discussion. Those of ordinary skill in the art, using the disclosures provided herein, will understand that the operations of any of the methods described herein may be adapted, expanded, performed simultaneously, omitted, rearranged, include steps not illustrated, and/or modified in various ways without deviating from the scope of the present disclosure.

At 302, the method includes providing a surface of a silicon carbide semiconductor wafer against an abrasive surface. For instance, the grind wheel 120 of FIG. 1 may be positioned such that the grinding teeth 122 are against the semiconductor wafer 105. As another example, the wafer carrier 230 of FIG. 3 may bring a silicon carbide semiconductor wafer 205 into contact with the grind disc 220.

At 304, the method includes imparting relative motion between the abrasive surface and the semiconductor wafer to implement a grinding operation on the semiconductor wafer. In some examples, imparting relative motion between the abrasive surface and the semiconductor wafer may include rotating the semiconductor wafer about a first axis and/or rotating the grinding apparatus about a second axis. For instance, in the grinding system of FIG. 1, the workpiece support 110 may be rotated about the first axis 104 and the grind wheel 120 may be rotated about the second axis 124. In some examples, the second axis 124 may be positioned such that the grind wheel 120 only partially overlaps the semiconductor wafer 105 during a grinding operation. As another example, in the grinding system of FIG. 3, the platen 210 may be rotated about a first axis 204. The workpiece carrier 230 may be rotated about a second axis 232. Other methods of imparting relative motion between the grinding apparatus and the semiconductor wafer may be used without deviating from the scope of the present disclosure.

At 306, the method includes providing a fluid to the surface of the semiconductor wafer and/or the abrasive surface during the grinding operation. In some examples, the fluid may be a coolant, such as deionized water. The fluid 133 may be provided in various ways. For instance, in the grinding system 100 of FIG. 1, the fluid may be provided from one or more fluid delivery outlets 132. In the grinding system 200 of FIG. 3, the fluid may be provided through one or more fluid delivery outlets 242.

According to examples of the present disclosure, the fluid includes an additive. In some examples, the additive may include one or more of an oxidizing agent, an etchant, or an abrasive containing additive. In some examples, the additive may include an actuatable additive.

For instance, in some examples, the additive may include an oxidizing agent. The oxidizing agent may be operable to oxidize one or more of the abrasive containing material of the grinding teeth and/or the semiconductor wafer. The oxidized portions may be later removed using an oxide removal process. In some examples, the oxidizing agent may include, for instance, one or more of hydrogen peroxide, urea peroxide, potassium hypochlorite, sodium hypochlorite, ammonium persulfate, potassium permanganate, potassium periodate, and/or potassium persulfate. In some examples, the oxidizing agent may include an organic peroxide, such as one or more of benzoyl peroxide or dimethyl peroxide. In some examples, the oxidizing agent includes hydrogen peroxide, and the fluid includes one or more $Fe^{+2}$ compounds. In some examples the oxidizing agent (e.g., hydrogen peroxide) may include additional chemical elements to improve their oxidizing properties, such as $NaHCO_3$ and/or $KHCO_3$.

In some examples, the additive may include an etchant. The etchant may be operable to chemically etch one or more of the semiconductor wafer and/or the abrasive containing material of the grind wheel. In some examples, the etchant is a caustic compound, such as potassium hydroxide, calcium hydroxide, or sodium hydroxide.

In some examples, the additive may include an additional abrasive containing additive. The abrasive containing additive may include a plurality of abrasive particles. The abrasive particles may include one or more of chromium oxide, cerium oxide, aluminum oxide, and/or silicon oxide.

FIG. 5 depicts a flow diagram of an example method 400 according to example embodiments of the present disclosure. The method 400 may be implemented, for instance, using the grinding system 100 of FIG. 1 or the grinding system 200 of FIG. 3. The method 400 depicts operations performed in a particular order for purposes of illustration and discussion. Those of ordinary skill in the art, using the disclosures provided herein, will understand that the operations of any of the methods described herein may be adapted, expanded, performed simultaneously, omitted, rearranged, include steps not illustrated, and/or modified in various ways without deviating from the scope of the present disclosure.

The method 400 of FIG. 5 is similar to the method 300 of FIG. 4. For instance, at 402, the method 400 includes providing a surface of a silicon carbide semiconductor wafer against an abrasive surface. For instance, the grind wheel 120 of FIG. 1 may be positioned such that the abrasive grinding teeth 122 are against the semiconductor wafer 105. As another example, the wafer carrier 230 of FIG. 3 may bring a silicon carbide semiconductor wafer 205 into contact with the grind disc 220.

At 404, the method includes imparting relative motion between the abrasive surface and the semiconductor wafer to implement a grinding operation on the semiconductor wafer. In some examples, imparting relative motion between the abrasive surface and the semiconductor wafer may include rotating the semiconductor wafer about a first axis and/or rotating the grinding apparatus about a second axis. For instance, in the grinding system of FIG. 1, the workpiece support 110 may be rotated about the first axis 104 and the grind wheel 120 may be rotated about the second axis 124. In some examples, the second axis 124 may be positioned such that grind wheel 120 only partially overlaps the semiconductor wafer 105 during a grinding operation. As another example, in the grinding system of FIG. 3, the platen 210 may be rotated about a first axis 204. The workpiece carrier may be rotated about a second axis 232. Other methods of imparting relative motion between the grinding apparatus and the semiconductor wafer may be used without deviating from the scope of the present disclosure.

At 406, the method includes providing a fluid to the surface of the semiconductor wafer and/or the abrasive during the grinding operation. In some examples, the fluid may be a coolant, such as deionized water. The fluid may be provided in various ways. For instance, in the grinding system 100 of FIG. 1, the fluid may be provided to the surface of the semiconductor wafer from one or more fluid delivery outlets 132. In the grinding system 200 of FIG. 3, the fluid may be provided through one or more fluid delivery outlets 242.

According to examples of the present disclosure, the fluid includes an additive. In some examples, the additive may be an actuatable additive. As described above, an actuatable additive is an additive that is responsive to a stimulus from an actuator to provide reactive properties during the grinding operation.

At 408, the method includes controlling an actuator to activate the actuatable additive during the grinding operation. For instance, the actuatable additive may include a material that is activated by one or more of an electrostatic actuator, electrochemical actuator, acoustic actuator, ultrasonic actuator, optical actuator, thermal actuator, or plasma-based actuator. For instance, in some embodiments, the actuatable additive may be inert and not react with an abrasive surface and/or the silicon carbide semiconductor wafer until the material is actuated by the external actuator. In some embodiments, the additive may be activated to react with the abrasive surface (e.g., the silicon carbide semiconductor wafer only when exposed (or not exposed) to the external stimulus from the actuator). In this way, the active properties of the additive may be controlled (e.g., pulsed) by controlling the actuator.

The actuator may be any suitable device operable to provide a stimulus to the additive to activate properties (e.g., reactive properties of the additive). For instance, the method may include controlling, with controller 160, the actuator 140 of FIG. 1 to provide a stimulus to the additive to activate properties of the actuatable additive. The method may include controlling, with controller 260, the actuator 270 of FIG. 3 to provide a stimulus to the additive to activate properties of the actuatable additive.

The actuator may include one or more of an electrostatic actuator, electrochemical actuator, acoustic actuator, ultrasonic actuator, optical actuator, ultraviolet actuator, thermal actuator, or plasma-based actuator. An electrochemical actuator may be operable to provide an electrochemical stimulus to the additive. An acoustic actuator may be operable to provide an acoustic stimulus to the additive. An ultrasonic actuator may be configured to provide an ultrasonic stimulus to the additive. An optical actuator may be configured to provide an optical stimulus to the additive. A thermal actuator may be operable to provide a heat stimulus to the additive (e.g., heat source, laser, lamp, etc.). An ultraviolet actuator may be operable to provide UV light stimulus to the additive. A plasma-based actuator may be operable to generate a plasma to act as a stimulus to the additive.

In some examples, for instance, an ultraviolet actuator may provide UV light stimulus to provide photochemical activation and/or photocatalytic effects in an actuatable additive, such as hydrogen peroxide and/or organic peroxide to generate, for instance, hydroxyl radicals. In some examples, activation of additives (e.g., photo activation of additives) may include using catalytic effects provided by providing elements or components in contact with the additive, such as $CeO_2$ elements, $TiO_2$ elements, or other metals and metal oxides in general.

One example aspect of the present disclosure is directed to a method for grinding a semiconductor workpiece. The method includes providing a surface of the semiconductor workpiece against a grinding apparatus, the grinding apparatus comprising an abrasive surface. The method further includes imparting relative motion between the abrasive surface and the semiconductor workpiece to implement a grinding operation on the semiconductor workpiece. The method further includes providing a fluid to the surface of the semiconductor workpiece or the abrasive surface during the grinding operation. The fluid includes an additive. The additive includes one or more of an oxidizing agent, an etchant, a surfactant, or a lubricant.

In some examples, the additive comprises the oxidizing agent.

In some examples, the oxidizing agent is operable to oxidize one or more grind products during the grinding operation.

In some examples, the oxidizing agent comprises one or more of hydrogen peroxide, urea peroxide, potassium hypochlorite, sodium hypochlorite, ammonium persulfate, potassium permanganate, potassium periodate, and/or potassium persulfate.

In some examples, the oxidizing agent comprises an organic peroxide.

In some examples, the organic peroxide comprises one or more of benzoyl peroxide or dimethyl peroxide.

In some examples, the oxidizing agent comprises hydrogen peroxide and the fluid comprises one or more Fe+2 compounds.

In some examples, the additive comprises the etchant.

In some examples, the etchant is operable to etch one or more of the semiconductor workpiece or the abrasive surface of the grinding apparatus.

In some examples, the etchant is a caustic compound.

In some examples, the etchant comprises potassium hydroxide, calcium hydroxide, or sodium hydroxide.

In some examples, the additive comprises an abrasive containing additive.

In some examples, the abrasive containing additive comprises a plurality of abrasive particles.

In some examples, the abrasive particles comprise one or more of chromium oxide, cerium oxide, aluminum oxide, or silicon oxide.

In some examples, a concentration of the additive in the fluid is in a range of 0.1% by volume to about 20% by volume.

In some examples, the fluid comprises a coolant.

In some examples, the coolant comprises deionized water.

In some examples, the additive is operable to remove at least a portion of the abrasive surface on the grinding apparatus.

In some examples, the additive is an actuatable additive, wherein the method comprises controlling an actuator to activate the actuatable additive during the grinding operation.

In some examples, the actuator comprises one or more of an electrostatic actuator, electrochemical actuator, acoustic actuator, ultrasonic actuator, optical actuator, thermal actuator, or plasma-based actuator.

In some examples, the actuatable additive comprises hydrogen peroxide or an organic peroxide and the actuator comprises an ultraviolet light source.

In some examples, providing the fluid comprises providing the fluid with a fluid delivery system comprising one or more fluid delivery outlets operable to deliver the fluid to the surface of the semiconductor workpiece.

In some examples, providing the fluid comprises providing a first fluid comprising a first additive; and providing a second fluid comprising a second additive.

In some examples, the first additive is provided through a different fluid delivery system relative to the second additive.

In some examples, the grinding operation reduces a thickness of a semiconductor workpiece by about 0.5 microns or greater.

In some examples, the grinding apparatus comprises a grind wheel with a plurality of grinding teeth.

In some examples, the grinding apparatus comprises a grind disc.

In some examples, the semiconductor workpiece comprises silicon carbide.

Another example aspect of the present disclosure is directed to a method for grinding a semiconductor workpiece. The method includes providing a surface of the semiconductor workpiece against a grinding apparatus having an abrasive surface. The method further includes imparting relative motion between the abrasive surface and the semiconductor workpiece to implement a grinding operation on the semiconductor workpiece. The method further includes providing a fluid to the surface of the semiconductor workpiece or to the abrasive surface during the grinding operation. The fluid comprises an actuatable additive.

In some examples, the method comprises controlling an actuator to activate the actuatable additive during the grinding operation.

In some examples, the actuator comprises one or more of an electrostatic actuator, electrochemical actuator, acoustic actuator, ultrasonic actuator, optical actuator, thermal actuator, or plasma-based actuator.

In some examples, providing the fluid comprises providing the fluid with a fluid delivery system comprising one or more fluid delivery outlets operable to deliver the fluid to the surface of the semiconductor workpiece.

In some examples, imparting relative motion between the abrasive surface and the semiconductor workpiece to implement a grinding operation on the semiconductor workpiece comprises one or more of: rotating the semiconductor workpiece about a first axis; or rotating the abrasive surface about a second axis.

In some examples, the grinding operation reduces a thickness of a semiconductor workpiece by about 0.5 microns or greater.

In some examples, the grinding apparatus comprises a grind wheel with a plurality of grinding teeth.

In some examples, the grinding apparatus comprises a grind disc.

In some examples, the semiconductor workpiece comprises silicon carbide.

Another example aspect of the present disclosure is directed to a grinding system for implementing a grinding operation on a semiconductor workpiece. The grinding system includes a workpiece support operable to support or carry a semiconductor workpiece. The grinding system further includes a grinding apparatus comprising an abrasive surface, the grinding apparatus operable to rotate about an axis to implement a grinding operation on the semiconductor workpiece. The grinding system further includes a fluid delivery system operable to deliver a fluid to a surface of the semiconductor workpiece during the grinding operation. The fluid comprises an additive, the additive comprising one or more of an oxidizing agent, an etchant, an abrasive containing additive, an actuatable additive, a surfactant, or a lubricant.

In some examples, the additive comprises the oxidizing agent.

In some examples, the oxidizing agent is operable to oxidize one or more grind products during the grinding operation.

In some examples, the oxidizing agent comprises one or more of hydrogen peroxide, urea peroxide, potassium hypochlorite, sodium hypochlorite, ammonium persulfate, potassium permanganate, potassium periodate, and/or potassium persulfate.

In some examples, the oxidizing agent comprises an organic peroxide.

In some examples, the organic peroxide comprises one or more of benzoyl peroxide or dimethyl peroxide.

In some examples, the oxidizing agent comprises hydrogen peroxide and the fluid comprises one or more $Fe+2$ compounds.

In some examples, the additive comprises the etchant.

In some examples, the etchant is operable to etch one or more of the semiconductor workpiece or the abrasive surface.

In some examples, the etchant is a caustic compound.

In some examples, the etchant comprises potassium hydroxide, calcium hydroxide, or sodium hydroxide.

In some examples, the additive comprises an abrasive containing additive.

In some examples, the abrasive containing additive comprises a plurality of abrasive particles.

In some examples, the abrasive particles comprise one or more of chromium oxide, cerium oxide, aluminum oxide, or silicon oxide.

In some examples, a concentration of the additive in the fluid is in a range of 0.1% by volume to about 20% by volume.

In some examples, the fluid comprises a coolant, the coolant comprising deionized water.

In some examples, the additive is an actuatable additive, wherein the system comprises a controller operable to control an actuator to activate the actuatable additive during the grinding operation.

In some examples, the actuator comprises one or more of an electrostatic actuator, electrochemical actuator, acoustic actuator, ultrasonic actuator, optical actuator, thermal actuator, or plasma-based actuator.

In some examples, the workpiece support comprises a chuck.

In some examples, the fluid delivery system comprises one or more fluid outlets operable to deliver the fluid to the surface of the semiconductor workpiece.

In some examples, the grinding apparatus comprises a grind wheel with a plurality of grinding teeth.

In some examples, the grinding apparatus comprises a grind disc.

In some examples, the semiconductor workpiece comprises silicon carbide.

Another example aspect of the present disclosure is directed to a method for grinding a semiconductor workpiece. The method includes providing a surface of the semiconductor workpiece against a grinding apparatus, the grinding apparatus comprising an abrasive surface. The method further includes imparting relative motion between the abrasive surface and the semiconductor workpiece to implement a grinding operation on the semiconductor workpiece. The method further includes providing a coolant to the surface of the semiconductor workpiece or the abrasive surface during the grinding operation. The coolant comprises an abrasive containing additive.

In some examples, the abrasive containing additive comprises a plurality of fine abrasive particles having a largest dimension of less than about 100 microns.

In some examples, the abrasive containing additive comprises one or more of chromium oxide, cerium oxide, aluminum oxide, and/or silicon oxide.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for grinding a silicon carbide semiconductor workpiece, comprising:

providing a surface of the silicon carbide semiconductor workpiece against a grinding apparatus, the grinding apparatus comprising a grind wheel comprising an abrasive surface, the abrasive surface comprising abrasive elements comprising one or more of diamond, ceramic, metal nitride, metal oxide, metal carbide, metalloid nitride, metalloid oxide, metalloid carbide, carbon group nitride, carbon group oxide, or carbon group carbide;

imparting relative motion between the abrasive surface and the silicon carbide semiconductor workpiece to implement a grinding operation on the silicon carbide semiconductor workpiece; and providing a fluid to the surface of the silicon carbide semiconductor workpiece or the abrasive surface during the grinding operation;

wherein the fluid comprises an additive, the additive comprising one or more of an oxidizing agent, an etchant, a surfactant, or a lubricant, wherein the grinding operation reduces a thickness of the silicon carbide semiconductor workpiece by about 0.5 microns or greater, and wherein the fluid does not contain abrasive particles.

2. The method of claim 1, wherein the additive comprises the oxidizing agent.

3. The method of claim 2, wherein the oxidizing agent is operable to oxidize one or more grind products during the grinding operation.

4. The method of claim 2, wherein the oxidizing agent comprises one or more of hydrogen peroxide, urea peroxide, potassium hypochlorite, sodium hypochlorite, ammonium persulfate, potassium permanganate, potassium periodate, and/or potassium persulfate.

5. The method of claim 2, wherein the oxidizing agent comprises an organic peroxide.

6. The method of claim 5, wherein the organic peroxide comprises one or more of benzoyl peroxide or dimethyl peroxide.

7. The method of claim 2, wherein the oxidizing agent comprises hydrogen peroxide and the fluid comprises one or more $Fe+2$ compounds.

8. The method of claim 1, wherein the additive comprises the etchant.

9. The method of claim 8, wherein the etchant is operable to etch one or more of the silicon carbide semiconductor workpiece or the abrasive surface of the grinding apparatus.

10. The method of claim 8, wherein the etchant is a caustic compound.

11. The method of claim 8, wherein the etchant comprises potassium hydroxide, calcium hydroxide, or sodium hydroxide.

12. The method of claim 1, wherein a concentration of the additive in the fluid is in a range of 0.1% by volume to about 20% by volume.

13. The method of claim 1, wherein the fluid comprises a coolant.

14. The method of claim 13, wherein the coolant comprises deionized water.

15. The method of claim 1, wherein the additive is an actuatable additive, wherein the method comprises controlling an actuator to activate the actuatable additive during the grinding operation.

16. The method of claim 15, wherein the actuator comprises one or more of an electrostatic actuator, electrochemical actuator, acoustic actuator, ultrasonic actuator, optical actuator, thermal actuator, or plasma-based actuator.

17. The method of claim 1, wherein the grinding operation reduces the thickness of the silicon carbide semiconductor workpiece by about 3 microns or greater.

18. The method of claim 1, wherein the grinding operation reduces the thickness of the silicon carbide semiconductor workpiece by about 5 microns or greater.

19. The method of claim 1, wherein the grinding operation reduces the thickness of the silicon carbide semiconductor workpiece by about 20 microns or greater.

20. The method of claim 1, wherein the grind wheel comprises a plurality of grinding teeth arranged in an annular configuration about a center of the grind wheel, wherein there is a space between each of the grinding teeth.

21. The method of claim 1, wherein the additive is an actuatable additive, wherein the method comprises controlling an actuator to activate the actuatable additive during the grinding operation, and wherein the actuator comprises one or more of an electrostatic actuator, electrochemical actuator, acoustic actuator, ultrasonic actuator, thermal actuator, or plasma-based actuator.

22. A method for grinding a silicon carbide semiconductor workpiece, comprising:

providing a surface of the silicon carbide semiconductor workpiece against a grinding apparatus, the grinding apparatus comprising a grind wheel with a plurality of grinding teeth comprising an abrasive surface, the abrasive surface comprising abrasive elements comprising one or more of diamond, ceramic, metal nitride, metal oxide, metal carbide, metalloid nitride, metalloid oxide, metalloid carbide, carbon group nitride, carbon group oxide, or carbon group carbide;

imparting relative motion between the abrasive surface and the silicon carbide semiconductor workpiece to implement a grinding operation on the silicon carbide semiconductor workpiece; and providing a fluid to the surface of the silicon carbide semiconductor workpiece or the abrasive surface during the grinding operation;

wherein the fluid comprises an additive, the additive comprising one or more of an oxidizing agent, an etchant, a surfactant, or a lubricant, wherein the fluid does not contain abrasive particles, wherein the grinding operation reduces a thickness of the silicon carbide semiconductor workpiece by about 0.5 microns or greater, and wherein (a) the grind wheel comprises a plurality of grinding teeth arranged in a concentric ring about a center of the grind wheel, wherein there is a space between each of the grinding teeth; or (b) the additive is an actuatable additive, wherein the method comprises controlling an actuator to activate the actuatable additive during the grinding operation, and wherein the actuator comprises one or more of an electrostatic actuator, electrochemical actuator, acoustic actuator, ultrasonic actuator, thermal actuator, or plasma-based actuator.

* * * * *